United States Patent
Tsunoda et al.

(10) Patent No.: US 10,067,155 B2
(45) Date of Patent: Sep. 4, 2018

(54) METHOD AND APPARATUS FOR FABRICATING ELECTROSTATIC CAPACITANCE-TYPE ACCELERATION SENSOR AND ELECTROSTATIC CAPACITANCE-TYPE ACCELERATION SENSOR

(71) Applicants: AKEBONO BRAKE INDUSTRY CO., LTD., Tokyo (JP); JAPAN OIL, GAS AND METALS NATIONAL CORPORATION, Tokyo (JP)

(72) Inventors: Takahiro Tsunoda, Tokyo (JP); Takashi Kunimi, Tokyo (JP); Toru Sekine, Tokyo (JP)

(73) Assignees: AKEBONO BRAKE INDUSTRY CO., LTD., Tokyo (JP); JAPAN OIL, GAS AND METALS NATIONAL CORPORATION, Tokyo (JP)

( * ) Notice: Subject to any disclaimer, the term of this patent is extended or adjusted under 35 U.S.C. 154(b) by 346 days.

(21) Appl. No.: 14/388,520

(22) PCT Filed: Mar. 15, 2013

(86) PCT No.: PCT/JP2013/057467
§ 371 (c)(1),
(2) Date: Sep. 26, 2014

(87) PCT Pub. No.: WO2013/146368
PCT Pub. Date: Oct. 3, 2013

(65) Prior Publication Data
US 2015/0053003 A1    Feb. 26, 2015

(30) Foreign Application Priority Data

Mar. 29, 2012  (JP) .................. 2012-078169

(51) Int. Cl.
*G01P 15/08*    (2006.01)
*B81B 7/00*    (2006.01)
(Continued)

(52) U.S. Cl.
CPC .......... *G01P 15/125* (2013.01); *B81B 3/0021* (2013.01); *B81C 1/00301* (2013.01);
(Continued)

(58) Field of Classification Search
CPC .......... G01P 15/125; G01P 2015/0837; G01P 1/023; G01C 19/5719; G01C 19/5769; G01C 19/5733; B81B 7/0041
See application file for complete search history.

(56) References Cited

U.S. PATENT DOCUMENTS

2002/0051258 A1   5/2002   Tamura
2006/0163679 A1   7/2006   LaFond et al.
(Continued)

FOREIGN PATENT DOCUMENTS

EP    1 167 979 A2    1/2002
JP    H05-142252 A    6/1993
(Continued)

OTHER PUBLICATIONS

Extended European Search Report dated Jul. 14, 2015 from corresponding European Application No. 13 76 9927 (4 pages).

*Primary Examiner* — Blake A Tankersley
*Assistant Examiner* — Ruben Parco, Jr.
(74) *Attorney, Agent, or Firm* — Drinker Biddle & Reath LLP

(57) ABSTRACT

In a method for fabricating an electrostatic capacitance-type acceleration sensor having a capacitor which electrostatic capacitance between a movable electrode and a fixed electrode changes according to the displacement of the movable electrode, the method includes: a step of forming a groove
(Continued)

on at least one of the surface of an insulative substrate and the surface of a semiconductor substrate; a step of forming a hole in the semiconductor substrate so as to penetrate the semiconductor substrate at a position communicating with a passage formed by the groove; and a step of forming an electrode extraction hole in the insulative substrate so as to penetrate the insulative substrate, at a position communicating with the passage formed by the groove.

4 Claims, 6 Drawing Sheets

(51) Int. Cl.
G01P 15/125 (2006.01)
B81C 1/00 (2006.01)
B81B 3/00 (2006.01)

(52) U.S. Cl.
CPC ...... *B81C 1/00531* (2013.01); *G01P 15/0802* (2013.01); *B81B 7/0038* (2013.01); *B81B 2201/0221* (2013.01); *B81B 2201/0235* (2013.01); *B81B 2203/0118* (2013.01); *B81B 2203/04* (2013.01); *B81B 2207/095* (2013.01); *B81B 2207/096* (2013.01); *Y10T 29/41* (2015.01)

(56) References Cited

U.S. PATENT DOCUMENTS

2010/0290199 A1\* 11/2010 Schmid ................. B81C 1/0023
                                                                        361/752
2012/0299127 A1\* 11/2012 Fujii ................... B60C 23/0488
                                                                        257/415

FOREIGN PATENT DOCUMENTS

| JP | H06-160420 A | | 6/1994 | |
|----|---|---|---|---|
| JP | 07128364 A | \* | 5/1995 | ............ G01P 15/125 |
| JP | H07-128364 A | | 5/1995 | |
| JP | H07-245417 A | | 9/1995 | |
| JP | 2002-005950 A | | 1/2002 | |
| JP | 2008-528968 A | | 7/2008 | |
| JP | 2010-145212 A | | 7/2010 | |
| JP | 2011-095010 A | | 5/2011 | |

\* cited by examiner (A)

(B)

METHOD AND APPARATUS FOR FABRICATING ELECTROSTATIC CAPACITANCE-TYPE ACCELERATION SENSOR AND ELECTROSTATIC CAPACITANCE-TYPE ACCELERATION SENSOR

TECHNICAL FIELD

The present invention relates to a method and apparatus for fabricating an electrostatic capacitance-type acceleration sensor and the electrostatic capacitance-type acceleration sensor.

BACKGROUND ART

An acceleration sensor is utilized in a wide range of fields such as an air-bag for an automobile, a game machine, seismic experiment. As the acceleration sensor, there is an electrostatic capacitance-type acceleration sensor which detects acceleration based on the change of electrostatic capacitance caused by the displacement of a movable electrode disposed between fixed electrodes, for example (see patent literatures 1 and 2).

CITATION LIST

Patent Literature

[PATENT LITERATURE 1] JP-A-2010-145212
[PATENT LITERATURE 2] JP-A-7-245417

SUMMARY OF INVENTION

Technical Problem

In recent years, the electrostatic capacitance-type acceleration sensor has been improved in its frequency characteristics in a manner that the sensitivity thereof is extended to a higher-frequency band of several thousand Hz from about 0 Hz. In order to cope with such the various frequency bands, the pressure of the inside of sensor elements in which the movable electrode is disposed is adjusted to a suitable value, to thereby increase/decrease the damping capacity of vibration by the damping effect of gas, for example.

As the electrostatic capacitance-type acceleration sensor in recent years, there is one in which constituent components such as fixed electrodes, a movable electrode and a cantilever for supporting the movable electrode are configured by integrating silicon substrates or glass substrates, that is, by a so-called MEMS (Micro-Electro Mechanism Systems). In this specification, the constituent components such as the fixed electrodes, the movable electrode and the cantilever are collectively called as sensor elements. In particular, a space sandwiched between the movable electrode and the fixed electrode is called as the inside of the sensor elements. In such the electrostatic capacitance-type acceleration sensor, in a case where a ventilation passage is provided at the silicon substrate or the glass substrate in order to adjust the pressure of the inside of the sensor elements to a suitable value, foreign matter may enter into the inside of the sensor elements via the ventilation passage at the time of cutting out each of the sensors from a wafer.

This invention has been developed in view of the aforesaid circumstances. An object of this invention is to provide a method and apparatus for fabricating an electrostatic capacitance-type acceleration sensor and the electrostatic capacitance-type acceleration sensor each of which can improve yield at the time of fabricating the electrostatic capacitance-type acceleration sensor provided with a ventilation passage for adjusting a pressure of the inside of sensor elements.

Solution to Problem

In order to attain the aforesaid object, according to this invention, a groove is provided so as to form a passage between an insulative substrate for forming the fixed electrode of a capacitor as a film and a semiconductor substrate joined to the insulative substrate, then a through hole communicating with the passage is formed at the semiconductor substrate, and an electrode extraction hole for electrically connecting the fixed electrode to the semiconductor substrate is formed at the insulative substrate as a through hole for communicating with the passage.

In detail, in a method for fabricating an electrostatic capacitance-type acceleration sensor having a capacitor which electrostatic capacitance between a movable electrode and a fixed electrode changes according to displacement of the movable electrode, the method includes: a step of forming a groove on at least one of one surface of an insulative substrate on which the fixed electrode is formed as a film and one surface of a semiconductor substrate to which the insulative substrate is joined, the one surface of the insulative substrate being on an opposite side of the other surface thereof on which the fixed electrode is formed as the film, and the insulative substrate being joined to the one surface of the semiconductor substrate; a step of forming a hole in the semiconductor substrate so as to penetrate from the one surface to the other surface of the semiconductor substrate, at a position communicating with a passage formed by the groove; and a step of forming an electrode extraction hole, for electrically connecting the fixed electrode to the semiconductor substrate, in the insulative substrate so as to penetrate from the one surface to the other surface of the insulative substrate, at a position communicating with the passage formed by the groove.

When the electrostatic capacitance-type acceleration sensor is fabricated in this manner, even when the movable electrode opposing to the fixed electrode is covered by the insulative substrate and the semiconductor substrate, the inside of sensor elements in which the movable electrode is disposed communicates with the hole penetrating the semiconductor substrate, via the passage formed between the semiconductor substrate and the insulative substrate from the hole of the insulative substrate for electrically connecting the fixed electrode to the semiconductor substrate. Thus, the pressure of the inside of the sensor elements can be adjusted to a suitable value.

Further, since the hole for communicating the inside of the sensor elements with the outside is formed so as to penetrate the semiconductor substrate, the hole can be opened at the upper surface or the lower surface of a wafer in which the acceleration sensors are formed by laminating the semiconductor substrates and the insulative substrates. In other words, when the electrostatic capacitance-type acceleration sensor is fabricated according to the aforesaid fabricating method, the hole communicating the inside of the sensor elements with the outside is not opened at a cut surface appearing upon cutting out the acceleration sensor from the wafer. Thus, foreign matter scarcely enters into the inside of the sensor elements at the time of the cutting out. Thus, yield can be improved at the time of fabricating the electrostatic capacitance-type acceleration sensor provided with the ventilation passage for adjusting the pressure of the inside of the sensor elements.

The electrostatic capacitance-type acceleration sensor may include a first capacitor which electrostatic capacitance between the movable electrode and a first fixed electrode changes according to the displacement of the movable electrode; and a second capacitor which electrostatic capacitance between the movable electrode and a second fixed electrode changes according to the displacement of the movable electrode in a contrary manner to the first capacitor, wherein the step of forming the groove may form the groove on at least one of the one surface of the insulative substrate on which one of the first fixed electrode and the second fixed electrode is formed as the film and the one surface of the semiconductor substrate to which the insulative substrate is joined, the one surface of the insulative substrate being on the opposite side of the other surface thereof on which the fixed electrode is formed as the film, and the insulative substrate being joined to the one surface of the semiconductor substrate.

The electrostatic capacitance-type acceleration sensor includes the first capacitor which capacitance changes according to acceleration and the second capacitor which capacitance changes in a contrary manner to the first capacitor. Thus, the acceleration can be measured with high sensitivity. In the case of fabricating such the electrostatic capacitance-type acceleration sensor, so long as the hole for communicating the inside of the sensor elements with the outside is provided on one of the first capacitor side and the second capacitor side, the pressure of the inside of the sensor elements can be adjusted. Further, the yield at the time of the fabrication can be improved as compared with the case of providing a plurality of the holes.

Further, the step of forming the hole in the insulative substrate may form the hole in the insulative substrate, to which the semiconductor substrate is joined, from the surface side of the insulative substrate on which the fixed electrode is formed as the film. When the hole provided in the insulative substrate is formed in this manner, since the positioning at the time of mutually joining the semiconductor substrate and the insulative substrate can be facilitated, the hole can be easily communicated with the passage.

This invention can also be applied to the fabricating apparatus realizing the aforesaid fabricating method and the electrostatic capacitance-type acceleration sensor.

For example, this invention may be an apparatus for fabricating an electrostatic capacitance-type acceleration sensor having a capacitor which electrostatic capacitance between a movable electrode and a fixed electrode changes according to displacement of the movable electrode, in which the apparatus includes: means for forming a groove on at least one of one surface of an insulative substrate on which the fixed electrode is formed as a film and one surface of a semiconductor substrate to which the insulative substrate is joined, the one surface of the insulative substrate being on an opposite side of the other surface thereof on which the fixed electrode is formed as the film, and the insulative substrate being joined to the one surface of the semiconductor substrate; means for forming a hole in the semiconductor substrate so as to penetrate from the one surface to the other surface of the semiconductor substrate, at a position communicating with a passage formed by the groove; and means for forming an electrode extraction hole, for electrically connecting the fixed electrode to the semiconductor substrate, in the insulative substrate so as to penetrate from the one surface to the other surface of the insulative substrate, at a position communicating with the passage formed by the groove.

Further, this invention may be an electrostatic capacitance-type acceleration sensor having a capacitor which electrostatic capacitance between a movable electrode and a fixed electrode changes according to displacement acceleration of the movable electrode, in which the sensor includes: an insulative substrate on which the fixed electrode of the capacitor is formed as a film; and a semiconductor substrate which is joined to one surface of the insulative substrate on an opposite side of the other surface thereof on which the fixed electrode is formed as the film, wherein a groove is formed on at least one of the one surface of the insulative substrate and the one surface of the semiconductor substrate to which the insulative substrate is joined, the one surface of the insulative substrate being on the opposite side of the other surface thereof on which the fixed electrode is formed as the film, wherein a first hole is formed in the semiconductor substrate so as to penetrate from the one surface to the other surface of the semiconductor substrate, at a position communicating with a passage formed by the groove, and wherein a second hole for electrode extraction, for electrically connecting the fixed electrode to the semiconductor substrate, is formed in the insulative substrate so as to penetrate from the one surface to the other surface of the insulative substrate, at a position communicating with the passage formed by the groove.

Advantageous Effects of Invention

According to this invention, yield can be improved at the time of fabricating the electrostatic capacitance-type acceleration sensor provided with the ventilation passage for adjusting the pressure of the inside of the sensor elements.

DESCRIPTION OF EMBODIMENTS

Hereinafter, an embodiment according to this invention will be explained. The embodiment described below shows exemplarily one mode of this invention and the technical range of this invention is not limited to the following embodiment.

Figure 1:
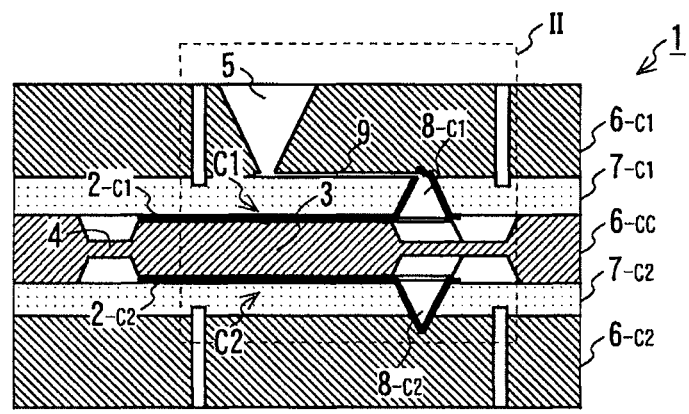
FIG. 1 is a diagram showing the configuration of an electrostatic capacitance-type acceleration sensor which is fabricated by an embodiment of the fabricating method according to this invention.

FIG. 1 is a diagram showing the configuration of an electrostatic capacitance-type acceleration sensor (hereinafter merely called as an acceleration sensor) 1 which is fabricated by the fabricating method according to this embodiment. The acceleration sensor 1 is a sensor which is configured by an MEMS (Micro-Electro Mechanism Systems) and also is an electrostatic capacitance-type acceleration sensor which includes capacitors C1 and C2 as shown in FIG. 1. In the acceleration sensor 1, the capacitors C1 and C2 are configured by combining two fine fixed electrodes $2_{-C1}$ and $2_{-C2}$ and a single movable electrode 3. As to this embodiment according to this invention, although the explanation is made as to a case where the two capacitors C1 and C2 are formed in the acceleration sensor 1, this invention can be applied to a case where the single capacitor C1 is formed in the acceleration sensor 1.

In the acceleration sensor 1, when an external force acts on the sensor to generate acceleration, a cantilever 4 bends to thereby displace the movable electrode 3. Thus, electrostatic capacitances between the movable electrode 3 and each of the fixed electrodes $2_{-C1}$ and $2_{-C2}$ change. That is, the acceleration sensor 1 is configured in a manner that the movable electrode 3 is disposed between the two opposed fixed electrodes $2_{-C1}$ and $2_{-C2}$. Thus, in a case where acceleration is generated in the acceleration sensor 1 and then the movable electrode 3 approaches the fixed electrodes $2_{-C1}$ on the capacitor C1 side, for example, the electrostatic capacitance of the capacitor C1 increases, whilst the electrostatic capacitance of the capacitor C2 decreases. In contrast, when the movable electrode 3 approaches the fixed electrodes $2_{-C2}$ on the capacitor C2 side, the electrostatic capacitance of the capacitor C2 increases, whilst the electrostatic capacitance of the capacitor C1 decreases. In a state where the acceleration is not generated, the electrostatic capacitance is same between the capacitor C1 and the capacitor C2. The electrostatic capacitances of the capacitor C1 and the capacitor C2 are transmitted as signals to silicon layers $6_{-C1}$ and $6_{-C2}$ electrically connected to the fixed electrodes $2_{-C1}$ and $2_{-C2}$, respectively. The signals outputted from the acceleration sensor 1 in this manner are processed by a predetermined signal processing circuit (not shown) in which the signals from the acceleration sensor 1 are inputted. Data processed by the predetermined signal processing circuit is used as the measurement results of various kinds of acceleration.

As shown in FIG. 1, a pressure adjustment hole 5 is formed at the silicon layer $6_{-C1}$ of the acceleration sensor 1. Thus, at the time of packaging the acceleration sensor 1 within a package (ceramic package, for example), the pressure adjustment hole 5 is sealed by means of the seam welding, for example, within atmosphere which pressure is adjusted to an arbitrary value. As a result, the movable electrode 3 and the fixed electrodes $2_{-C1}$ and $2_{-C2}$ are disposed as sensor elements, and a space sandwiched between the movable electrode 3 and the fixed electrode $2_{-C1}$ and a space sandwiched between the movable electrode 3 and the fixed electrode $2_{-C2}$ can be adjusted to a suitable pressure. In this embodiment, the constituent components such as the movable electrode 3, the fixed electrodes $2_{-C1}$ and $2_{-C2}$ and the cantilever are collectively called as sensor elements. In particular, each of the space sandwiched between the movable electrode 3 and the fixed electrode $2_{-C1}$ and the space sandwiched between the movable electrode 3 and the fixed electrode $2_{-C2}$ is called as the inside of the sensor elements. In this manner, when the pressure of the inside of the sensor elements is changed by changing the pressure of the atmosphere at the time of sealing the pressure adjustment hole 5, the damping capacity of vibration of the movable electrode supported by the cantilever 4 changes. Accordingly, the frequency characteristics of the acceleration sensor 1 can be tuned by suitably adjusting the pressure of the atmosphere at the time of sealing the pressure adjustment hole 5.

Figure 2:
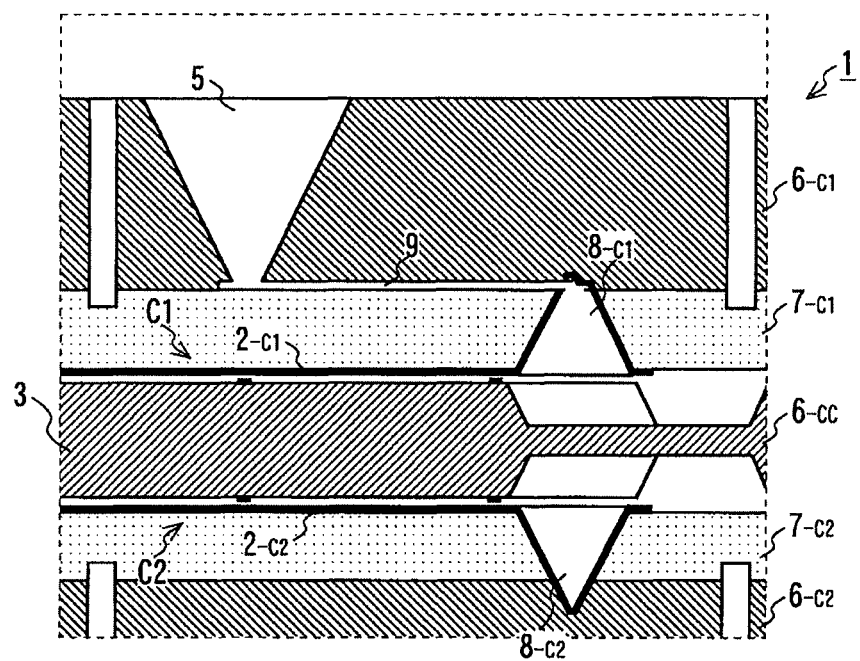
FIG. 2 is an enlarged diagram of a peripheral portion including a pressure adjustment hole of the electrostatic capacitance-type acceleration sensor according to this invention.

FIG. 2 is an enlarged diagram of a peripheral portion (portion denoted by a symbol II in FIG. 1) including the pressure adjustment hole 5 of the acceleration sensor 1. The acceleration sensor 1 is generally configured as a laminated structure in which a silicon layer $6_{-CC}$ forming the cantilever 4 and the movable electrode 3 is sandwiched between silicon layers $6_{-C1}$ and $6_{-C2}$ via glass layers $7_{-C1}$ and $7_{-C2}$. At the glass layer $7_{-C1}$ sandwiched between the silicon layer $6_{-CC}$ and the silicon layer $6_{-C1}$, the fixed electrode $2_{-C1}$ is formed on a surface of the glass layer $7_{-C1}$ (the lower surface of the glass layer $7_{-C1}$ in FIG. 2) facing on the silicon layer $6_{-CC}$. An external-electrode extraction through-hole $8_{-C1}$ is perforated within the glass layer $7_{-C1}$ from one surface to the other surface thereof. In the glass layer $7_{-C2}$ sandwiched between the silicon layer $6_{-CC}$ and the silicon layer $6_{-C2}$, the fixed electrode $2_{-C2}$ is formed on a surface of the glass layer $7_{-C2}$ (the upper surface of the glass layer $7_{-C2}$ in FIG. 2) facing on the silicon layer $6_{-CC}$. An external-electrode extraction through-hole $8_{-C2}$ is perforated within the glass layer $7_{-C2}$ from the one surface to the other surface thereof.

As shown in FIG. 2, between the glass layer $7_{-C1}$ and the silicon layer $6_{-C1}$, a pressure adjustment passage 9 is formed in a concave fashion at a surface of the silicon layer $6_{-C1}$ (the lower surface of the silicon layer $6_{-C1}$ in FIG. 2) facing on the glass layer $7_{-C1}$ (in this embodiment, the pressure adjustment passage 9 is formed by partially digging the surface of the silicon layer $6_{-C1}$ facing on the glass layer $7_{-C1}$). The pressure adjustment passage 9 is a ventilation passage communicating between the external-electrode extraction through-hole $8_{-C1}$ and the pressure adjustment hole 5, and also is an air passage for connecting between the inside of the sensor elements and the outside. In this embodiment, the pressure adjustment passage 9 is formed in the concave fashion at the surface of the silicon layer $6_{-C1}$ facing on the glass layer $7_{-C1}$. Alternatively, the pressure adjustment passage 9 may be formed in a concave fashion at the surface of the glass layer $7_{-C1}$ (the upper surface of the glass layer $7_{-C1}$ in FIG. 2) facing on the silicon layer $6_{-C1}$ (for example, the surface of the glass layer $7_{-C1}$ facing on the silicon layer $6_{-C1}$ may be partially dug).

The aforesaid acceleration sensor 1 is fabricated in the following manner. FIGS. 3(A) to 3(E) are diagrams showing processes of fabricating the acceleration sensor 1. The fabricating method described later can be realized by a predetermined fabricating apparatus.

(Step S101)

Figure 3:
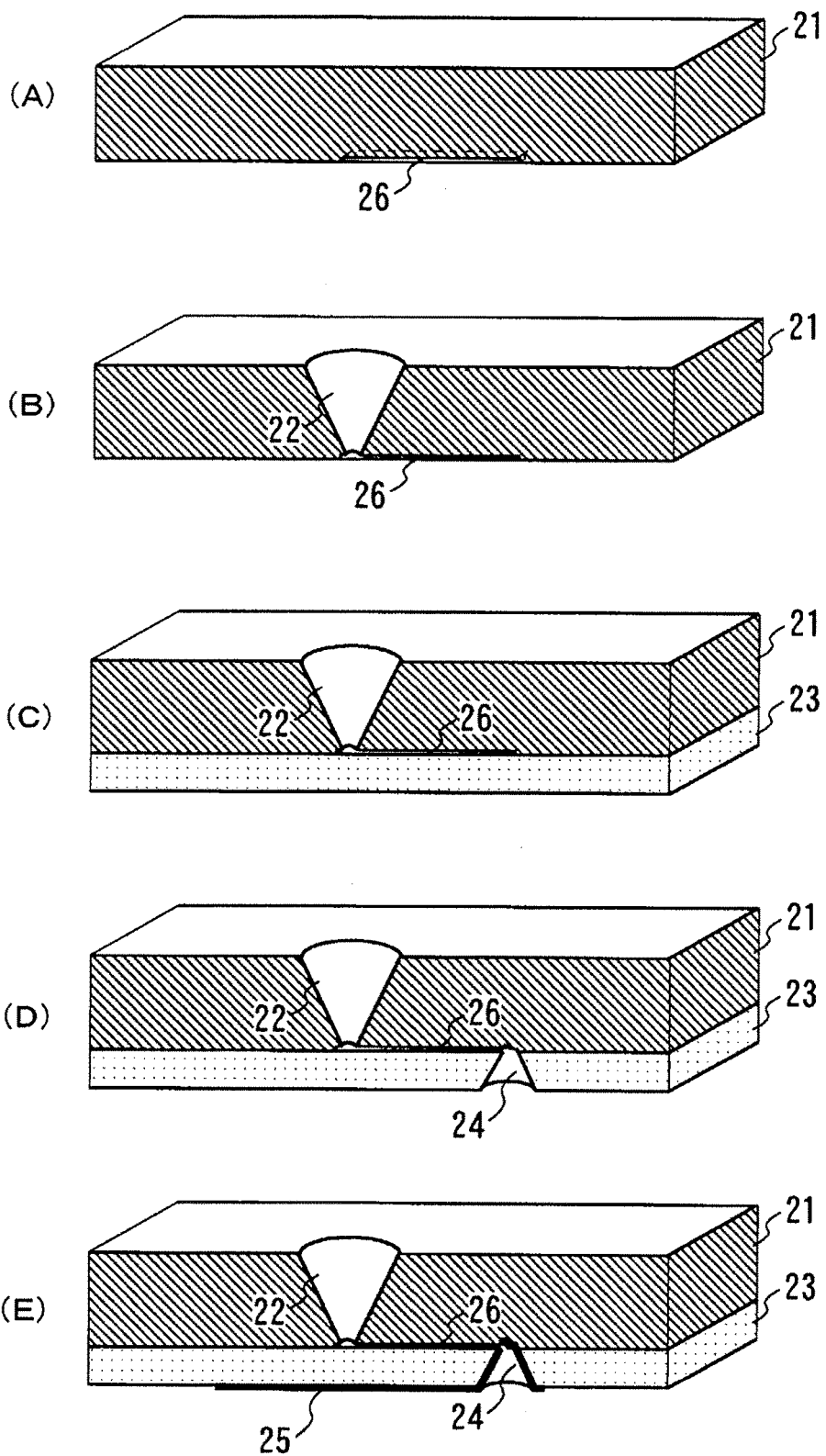
FIGS. 3(A) to 3(E) are diagrams showing processes of the embodiment of the fabricating method of the electrostatic capacitance-type acceleration sensor according to this invention.

In this fabricating method, as shown in FIG. 3(A), firstly, one surface of a silicon wafer 21 prepared in advance (lower surface of the silicon wafer 21 in FIG. 3(A)) is partially dug to thereby form a groove 26. This silicon wafer 21 forms the aforesaid silicon layer $6_{-C1}$ in the acceleration sensor 1 fabricated according to this fabricating method. The groove 26 is a hole corresponding to the aforesaid pressure adjustment passage 9. The method of partially digging the silicon wafer 21 may be any method, and a sufficient digging can be realized by employing DRIE (Deep Reactive Ion Etching), for example. The DRIE is a kind of the reactive ion etching and performs etching in a manner of accelerating ion species or radical species within plasma towards a sample and colliding therewith.

(Step S102)

Next, a hole 22 is formed so as to penetrate the silicon wafer 21 from the one surface to the other surface of the silicon wafer 21. In this case, the hole 22 is formed at a position communicating with the groove 26, that is, a position where the opening of the hole 22 formed on the lower surface side of the silicon wafer 21 overlaps with the groove 26 (see FIG. 3(B)). This hole 22 corresponds to the aforesaid pressure adjustment hole 5. The method of forming the hole 22 may be any method, and the hole 22 can be formed suitably by employing sandblast, for example.

(Step S103)

Next, as shown in FIG. 3(C), a glass substrate 23 is joined to the surface of the silicon wafer 21 on the dug side in step S101 (lower surface of the silicon wafer 21 in FIG. 3(C)). The glass substrate 23 forms the aforesaid glass layer $7_{\_C1}$ in the acceleration sensor fabricated by the fabricating method according to this embodiment. The method of joining the glass substrate 23 may be any method, and the glass substrate 23 can be firmly joined to the silicon wafer 21 by employing anodic bonding, for example. The anodic bonding is a kind of joining method between the silicon wafer 21 and the glass substrate 23, and is a joining method performed by applying a high voltage within high-temperature atmosphere.

(Step S104)

Next, a hole 24 is formed at the glass substrate 23 joined to the silicon wafer 21 in a manner that this hole penetrates the glass substrate 23 from the other surface of the glass substrate 23, on the opposite side of one surface thereof facing the silicon wafer 21, to the one surface thereof and reaches the silicon wafer 21. In this case, the hole 24 is formed at a position communicating with the groove 26, that is, a position where the opening of the hole 24 formed on the upper surface side of the glass substrate 23 overlaps with the groove 26 (see FIG. 3(D)). This hole 24 corresponds to the aforesaid external-electrode extraction through-hole $8_{\_C1}$ in the acceleration sensor 1 fabricated by the fabricating method according to this embodiment. The method of forming the hole 24 may be any method, and the hole 24 can be formed suitably by employing the sandblast, for example.

(Step S105)

Next, as shown in FIG. 3(E), an electrode 25 is formed as a film on the surface of the glass substrate 23 on the opposite side of the surface thereof joined to the silicon wafer 21 (lower surface of the glass substrate 23 in FIG. 3(E)). In this case, the electrode 25 is formed as a film so as to extend over an area opposing to the movable electrode 3 of the silicon layer $6_{\_CC}$ at the time of joining the silicon layer $6_{\_CC}$ to the glass substrate 23 in the succeeding process. Further, the electrode 25 is formed so as to also extend over the inner surface of the hole 24 formed in step S104 and a part of the surface of the silicon wafer 21 (lower surface of the silicon wafer 21 in FIG. 3(E)) which is viewed through the opening of the hole 24. This electrode 25 is an electrode corresponding to the aforesaid fixed electrode $2_{\_C1}$ in the acceleration sensor fabricated by the fabricating method according to this embodiment. The method of forming the electrode 25 may be any method, and the electrode 25 with a suitable film thickness can be formed by employing sputtering, for example.

When the aforesaid series of processes (steps S101 to S105) are performed as to the silicon wafer 21, the silicon layer $6_{\_C1}$, the glass layer $7_{\_C1}$ and the fixed electrode are sequentially laminated, thereby forming a first assembly including these layers. The silicon layer $6_{\_CC}$ is laminated on the surface of the glass layer $7_{\_C1}$ of the first assembly on the opposite side of the surface thereof joined to the silicon layer $6_{\_C1}$. Further, a second assembly including the fixed electrode $2_{\_C2}$, the glass layer $7_{\_C2}$ and the silicon layer $6_{\_C2}$ is joined to the surface of the silicon layer $6_{\_CC}$ on the opposite side of the surface thereof joined to the glass layer $7_{\_C1}$, thereby fabricating the aforesaid acceleration sensor 1. The process of joining the glass layer $7_{\_C2}$ and the silicon layer $6_{\_C2}$ to the silicon layer $6_{\_CC}$ which is joined to the silicon layer $6_{\_C1}$ and the glass layer $7_{\_C1}$ is as follows. That is, the glass layer $7_{\_C2}$ and the silicon layer $6_{\_C2}$ are sequentially laminated, and then glass layer $7_{\_C2}$ is partially perforated to form a hole which penetrates the glass substrate $7_{\_C2}$ from the one surface of the glass substrate layer $7_{\_C2}$ to the other surface thereof and reaches the silicon layer $6_{\_C2}$. At the time of joining the silicon layer $6_{\_C2}$ to the glass layer $7_{\_C2}$, the fixed electrode $2_{\_C2}$ is formed as a film so as to extend over an area opposing to the movable electrode 3 of the silicon layer $6_{\_CC}$, the inner surface of the hole thus formed and a part of the surface of the silicon layer $6_{\_C2}$ which is viewed through the opening of the hole. Then, the glass layer $7_{\_C2}$ of the second assembly thus having been fabricated is joined to the silicon layer $6_{\_CC}$.

In the aforesaid fabricating method, the acceleration sensors 1 are fabricated in a state that many acceleration sensors are aligned on a disc-shaped plate. The disc-shaped plate on which the many acceleration sensors 1 are aligned in this manner is hereinafter merely called as a wafer. Concerning the wafer, although there is a case that the wafer refers to a silicon wafer, the wafer in this embodiment is a laminated body formed by laminating silicon layers and glass layers and is not limited to one formed by silicon.

Figure 4:
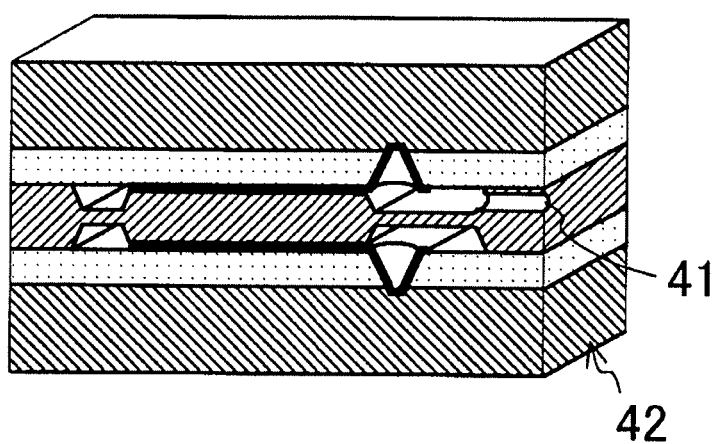
FIG. 4 is a diagram showing the configuration of a comparative example of an electrostatic capacitance-type acceleration sensor in which a pressure adjustment hole is provided on a cut surface side.

According to the wafer fabricated in this manner, even when the respective acceleration sensors 1 are cut out by cutting the wafer lengthwise and breadthwise, foreign matter scarcely enters into the inside of the sensor elements via the pressure adjustment hole 5. Hereinafter, the superiority of the acceleration sensor 1 according to this invention will be explained with reference to a comparative example of an acceleration sensor shown in FIG. 4. FIG. 4 is a diagram showing the configuration of the comparative example of an acceleration sensor in which a pressure adjustment hole is provided on a cut surface side. In the acceleration sensor shown in FIG. 4, the pressure adjustment hole 41 is perforated in parallel to silicon layers and glass layers, and the opening of the pressure adjustment hole 41 is formed on a cut surface 42. In the acceleration sensor provided with the cut surface 42 as shown in FIG. 4, a wafer is cut in the following manner.

Figure 5:
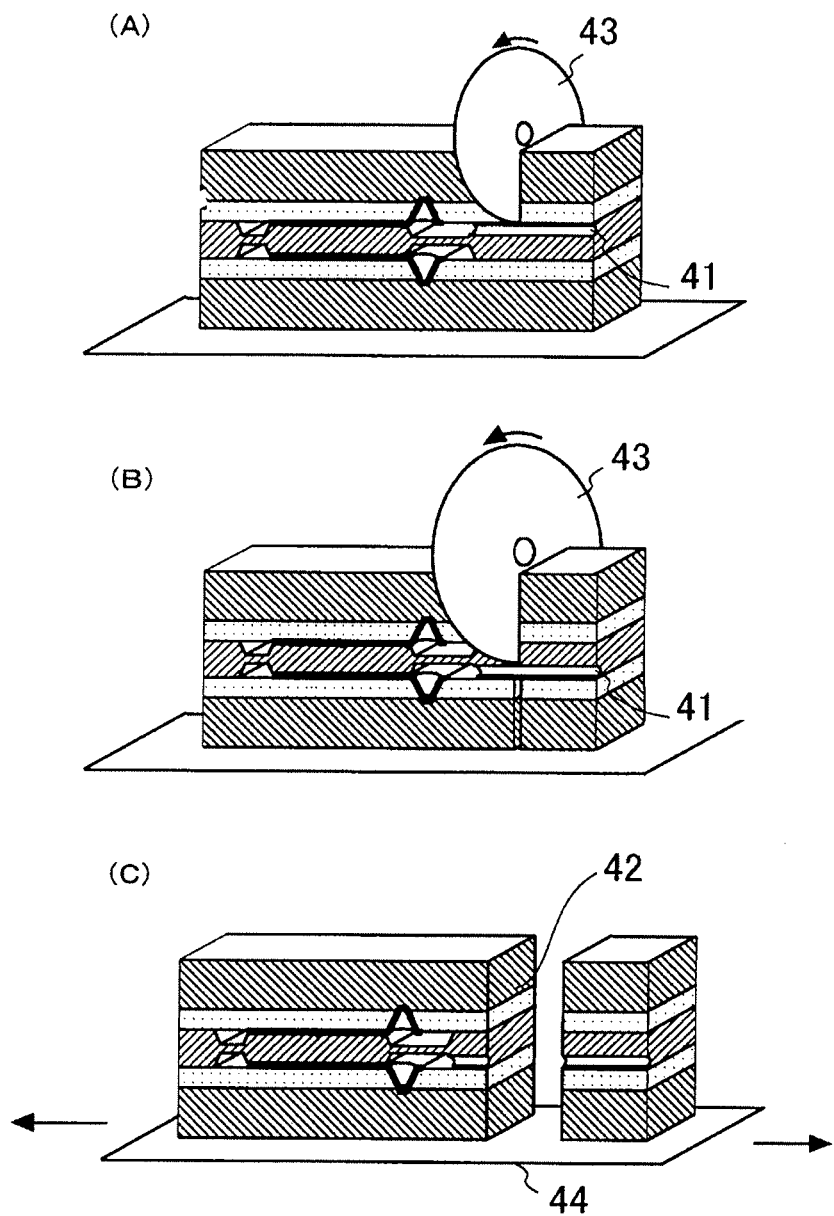
FIGS. 5(A) to 5(C) are diagrams showing processes of cutting out each of the electrostatic capacitance-type acceleration sensors from a wafer, as a comparative example.

FIGS. 5(A) to 5(C) are diagrams showing processes of cutting out each of the acceleration sensors from the wafer, as the comparative example. In the case where the opening of the pressure adjustment hole 41 is formed on the cut surface 42, a cutter 43, which is configured to slide in the lamination direction of the silicon layers and the glass layers of the wafer to cut the wafer in the same direction, is slid from the surface of the wafer to a position just before the pressure adjustment hole 41 (FIG. 5(A)). The cutter 43 is stopped just before the pressure adjustment hole 41 in order to prevent foreign matter, such as cutting chips and water generated at the time of cutting the wafer by the cutter 43, from entering into the inside of the sensor elements from the pressure adjustment hole 41. Next, the wafer is turned over and the cutter is slid from the other surface of the wafer to a position just before the pressure adjustment hole 41 (FIG.

5(B)). Then, lastly, a dicing tape 44 placing the wafer thereon is extended lengthwise and breadthwise to separate the respective acceleration sensors to each other, thereby completing the cutting out of the acceleration sensors (FIG. 5(C)).

In the case where the opening of the pressure adjustment hole 41 is provided on the cut surface 42, it is necessary to change and stick the dicing tape 44 at the time of turning over the wafer. Further, it is necessary to use the cutter 43 from both the major surface side and the rear surface side of the wafer. Furthermore, at the time of extending the dicing tape 44 lengthwise and breadthwise to separate the respective acceleration sensors to each other, foreign matter such as fragments of cracked members may enter into the inside of the sensor elements from the pressure adjustment hole.

However, according to the fabricating method of this invention, the opening of the pressure adjustment hole 5 is not formed on the cut surface but formed on the wafer surface. Thus, at the time of cutting the wafer and separating the respective acceleration sensors to each other, foreign matter is suppressed from entering into the inside of the sensor elements from the pressure adjustment hole. Further, since the pressure adjustment hole 5 is opened on the upper surface or the lower surface of the wafer, it is not necessary to stop the cutter just before the pressure adjustment hole. That is, the respective acceleration sensors 1 can be separately cut out completely from the wafer by merely cutting the wafer using the cutter. Thus, it is not necessary to turn over the wafer nor to change and stick the dicing tape. Further, since the respective acceleration sensors 1 can be separately cut out completely by merely cutting the wafer using the cutter, the member does not crack even if the dicing tape is extended lengthwise and breadthwise at the time of picking up the respective acceleration sensors 1. Thus, foreign matter can be suppressed from entering into the inside of the sensor elements from the pressure adjustment hole 5.

Figure 6:
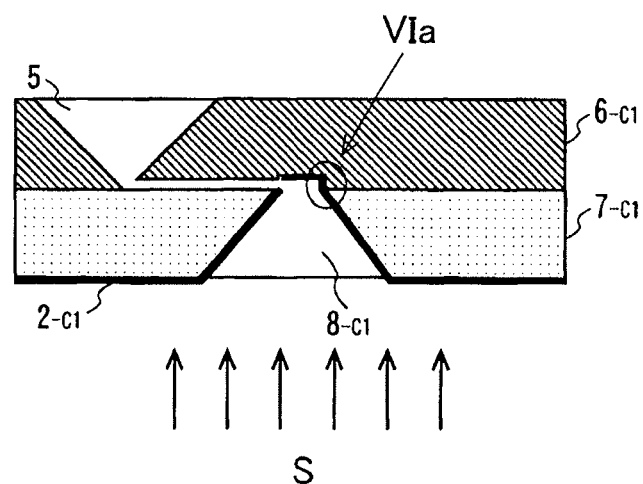
FIGS. 6(A) and 6(B) are diagrams each showing a state of the electrical connection between a fixed electrode and a silicon layer
Figure 6:
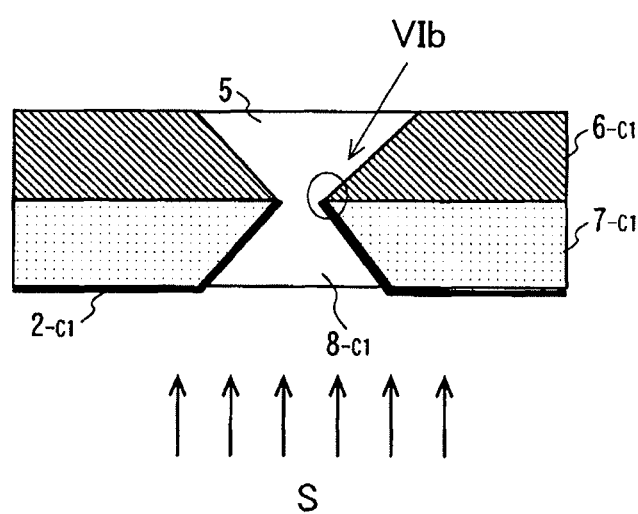

Further, according to the acceleration sensor 1 fabricated by the fabricating method of this invention, since the pressure adjustment hole 5 is connected to the external-electrode extraction through-hole $8_{\_C1}$ via the pressure adjustment passage 9, the electrical connection between the fixed electrode $2_{\_C1}$ and the silicon layer $6_{\_C1}$ is high in reliability. Hereinafter, concerning the reliability of the electrical connection between the fixed electrode $2_{\_C1}$ and the silicon layer $6_{\_C1}$, the superiority of the acceleration sensor 1 according to this invention will be explained with reference to FIGS. 6(A) and 6(B). Each of FIGS. 6(A) and 6(B) is a diagram showing a state of the electrical connection between the fixed electrode $2_{\_C1}$ and the silicon layer $6_{\_C1}$. FIG. 6(A) is a diagram showing the embodiment where the pressure adjustment hole 5 and the external-electrode extraction through-hole $8_{\_C1}$ are connected via the pressure adjustment passage 9. FIG. 6(B) is a diagram showing a comparative example where the pressure adjustment hole 5 and the external-electrode extraction through-hole $8_{\_C1}$ are directly connected.

As shown in FIG. 6(A), in the case of the fabricating method according to this embodiment, when the fixed electrode $2_{\_C1}$ is formed by the sputtering, for example, sputter particles S constituting the fixed electrode $2_{\_C1}$ can be sufficiently adhered to the silicon layer $6_{\_C1}$. This is because, since the opening of the external-electrode extraction through-hole $8_{\_C1}$ is covered by the silicon layer $6_{\_C1}$, the sputter particles adhere to the surface of the silicon layer $6_{\_C1}$ (lower surface of the silicon layer $6_{\_C1}$ in FIG. 6(A)) opposing to this opening (see within a circle shown by VIa in FIG. 6(A)). On the other hand, in the case of the comparative example shown in FIG. 6(B), the opening of the external-electrode extraction through-hole $8_{\_C1}$ is not covered by the silicon layer $6_{\_C1}$. Thus, the silicon layer $6_{\_C1}$ is not exposed when the external-electrode extraction through-hole $8_{\_C1}$ is viewed from the glass layer $7_{\_C1}$ side. Therefore, even if the fixed electrode $2_{\_C1}$ is formed by the sputtering, for example, the sputter particles constituting the fixed electrode $2_{\_C1}$ do not adhere to the surface of the silicon layer $6_{\_C1}$ (see within a circle shown by VIb in FIG. 6(B)). In this manner, according to the embodiment shown in FIG. 6(A), it will be understood that the reliability of the electrical connection between the fixed electrode $2_{\_C1}$ and the silicon layer $6_{\_C1}$ is improved as compared with the comparative example shown in FIG. 6(B).

Further, as shown in FIG. 6(A), in the case of the acceleration sensor 1 according to this embodiment, the pressure adjustment hole 5 and the external-electrode extraction through-hole $8_{\_C1}$ are connected via the pressure adjustment passage 9. Thus, even if a slight amount of foreign matter enters from the pressure adjustment hole 5, the foreign matter is forced to remain within the pressure adjustment passage 9. On the other hand, like the comparative example shown in FIG. 6(B), when the pressure adjustment hole 5 and the external-electrode extraction through-hole $8_{\_C1}$ are directly connected, foreign matter entered from the pressure adjustment hole 5 likely enters into the inside of the sensor elements. In this manner, according to the embodiment shown in FIG. 6(A), as compared with the comparative example shown in FIG. 6(B), even if a slight amount of foreign matter enters from the pressure adjustment hole 5, the foreign matter can be prevented from entering into the inside of the sensor elements.

The pressure adjustment passage 9 is not limited to one configured by a groove formed by digging the silicon wafer 21. For example, the pressure adjustment passage may be configured by a groove formed by digging the glass substrate 23. Alternatively, the pressure adjustment passage may be configured by grooves formed respectively by digging both the silicon wafer 21 and the glass substrate 23. Of the aforesaid processes of the fabricating method, the execution order from step S101 to step S104 is not limited to the aforesaid order. That is, these steps may be executed in a different order so long as the holes 22, 24 and the grove 26 are formed as shown in step S104. For example, the execution order of step S101 and step S102 may be exchanged (i.e., the processes of forming the groove 26 and the hole 22 in the silicon wafer 21 may be exchanged). Further, the execution order of step S103 and step S104 may be exchanged (i.e., the process of forming the hole 24 in the glass substrate 23 and the process of joining the silicon wafer 21 and the glass substrate 23 may be exchanged).

Figure 7:
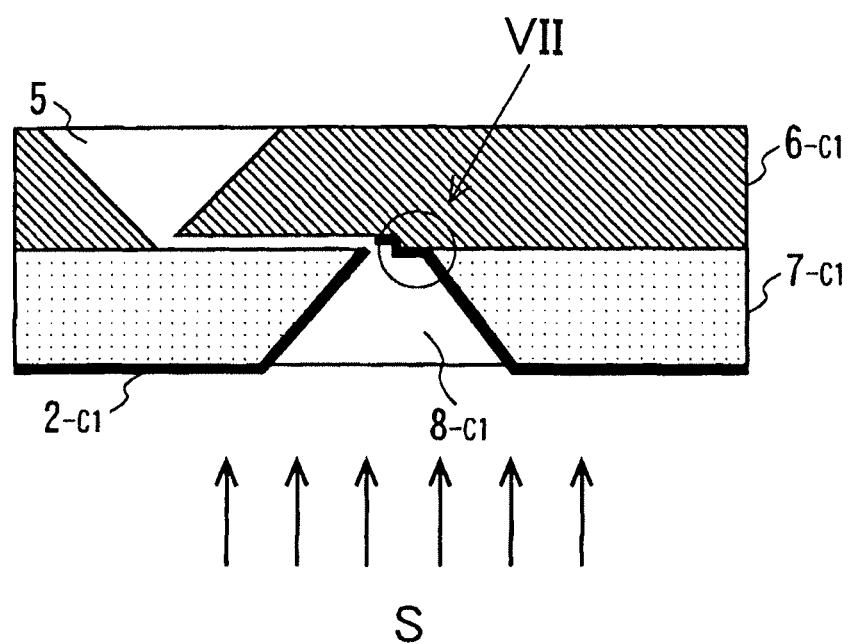
FIG. 7 is a diagram showing a state of the electrical connection between the fixed electrode and the silicon layer according to a modified example of the electrostatic capacitance-type acceleration sensor of this invention.

The acceleration sensor 1 may be deformed in the following manner. FIG. 7 is a diagram showing a state of the electrical connection between the fixed electrode $2_{\_C1}$ and the silicon layer $6_{\_C1}$ according to the modified example of the acceleration sensor of this invention.

In the acceleration sensor of FIG. 7, a wall surface defining the external-electrode extraction through-hole $8_{\_C1}$ and a ceiling surface, covering the opening of the external-electrode extraction through-hole $8_{\_C1}$ located on the silicon layer $6_{\_C1}$ side, are constituted in the following manner. That is, in the aforesaid embodiment, as shown in the explanation concerning step S104 and FIG. 6(A), the hole 24 is formed so as to have a depth to the extent that the silicon wafer 21 is slightly dug. On the other hand, at the time of forming this hole in the acceleration sensor of FIG. 7, the forming of this hole is stopped at a time point just before the digging of the silicon wafer after penetrating the glass substrate. In this respect, this hole is formed at a position where the opening formed on the silicon wafer side overlaps the end portion of the groove formed in step S101. Thus, a part of the lower surface of the silicon wafer is formed as the ceiling surface extending from the inner edge of the opening formed on the silicon wafer side of the hole. In other words, the ceiling surface, covering the opening of the external-electrode extraction through-hole $8_{\_C1}$ and being formed by the silicon layer $6_{\_C1}$, is formed so as to continue to the wall surface within the external-electrode extraction through-hole $8_{\_C1}$ formed by the glass layer $7_{\_C1}$. As a result, the film of the sputter particles is continuously formed between the ceiling surface and the wall surface within the external-electrode extraction through-hole $8_{\_C1}$ (see within a circle shown by VII in FIG. 7). Thus, since the fixed electrode $2_{\_C1}$ and the silicon layer $6_{\_C1}$ are surely connected electrically, occurrence of the electrical conduction failure can be prevented.

The features of the embodiment of the method and apparatus for fabricating the electrostatic capacitance-type acceleration sensor and the electrostatic capacitance-type acceleration sensor according to this invention will be briefly listed below as items [1] to [5].

[1] The method for fabricating the electrostatic capacitance-type acceleration sensor having the capacitor (C1) which electrostatic capacitance between the movable electrode (3) and the fixed electrode ($2_{\_C1}$) changes according to the displacement of the movable electrode (3), the method includes:

the step of forming the groove (26) on at least one of the one surface of the insulative substrate ($7_{\_C1}$) on which the fixed electrode ($2_{\_C1}$) is formed as the film and the one surface of the semiconductor substrate ($6_{\_C1}$) to which the insulative substrate ($7_{\_C1}$) is joined, the one surface of the insulative substrate being on the opposite side of the other surface thereof on which the fixed electrode ($2_{\_C1}$) is formed as the film, and the insulative substrate ($7_{\_C1}$) being joined to the one surface of the semiconductor substrate;

the step of forming the hole (22) in the semiconductor substrate ($6_{\_C1}$) so as to penetrate from the one surface to the other surface of the semiconductor substrate ($6_{\_C1}$), at the position communicating with the passage formed by the groove (26); and the step of forming the electrode extraction hole (24), for electrically connecting the fixed electrode ($2_{\_C1}$) to the semiconductor substrate ($6_{\_C1}$), in the insulative substrate ($7_{\_C1}$) so as to penetrate from the one surface to the other surface of the insulative substrate ($7_{\_C1}$), at the position communicating with the passage formed by the groove (26).

[2] The method for fabricating the electrostatic capacitance-type acceleration sensor described in [1], wherein the electrostatic capacitance-type acceleration sensor includes the first capacitor (C1) which electrostatic capacitance between the movable electrode (3) and the first fixed electrode ($2_{\_C1}$) changes according to the displacement of the movable electrode (3), and the second capacitor (C2) which electrostatic capacitance between the movable electrode (3) and the second fixed electrode ($2_{\_C2}$) changes according to the displacement of the movable electrode (3) in a contrary manner to the first capacitor, and wherein the step of forming the groove (26) forms the groove (26) on at least one of the one surface of the insulative substrate ($7_{\_C1}$) on which one of the first fixed electrode ($2_{\_C1}$) and the second fixed electrode ($2_{\_C2}$) is formed as the film and the one surface of the semiconductor substrate ($6_{\_C1}$) to which the insulative substrate (TO is joined, the one surface of the insulative substrate being on the opposite side of the other surface thereof on which the fixed electrode ($2_{\_C1}$) is formed as the film, and the insulative substrate ($7_{\_C1}$) being joined to the one surface of the semiconductor substrate.

[3] The method for fabricating the electrostatic capacitance-type acceleration sensor described in [1] or [2], wherein the step of forming the hole (24) in the insulative substrate ($7_{\_C1}$) forms the hole (24) in the insulative substrate ($7_{\_C1}$), to which the semiconductor substrate ($6_{\_C1}$) is joined, from the surface side of the insulative substrate ($7_{\_C1}$) on which the fixed electrode ($2_{\_C1}$) is formed as the film.

[4] The apparatus for fabricating the electrostatic capacitance-type acceleration sensor having the capacitor (C1) which electrostatic capacitance between the movable electrode (3) and the fixed electrode ($2_{\_C1}$) changes according to the displacement of the movable electrode (3), the apparatus includes:

the means for forming the groove (26) on at least one of the one surface of the insulative substrate ($7_{\_C1}$) on which the fixed electrode ($2_{\_C1}$) is formed as the film and the one surface of the semiconductor substrate (6–C1) to which the insulative substrate ($7_{\_C1}$) is joined, the one surface of the insulative substrate being on the opposite side of the other surface thereof on which the fixed electrode ($2_{\_C1}$) is formed as the film, and the insulative substrate ($7_{\_C1}$) being joined to the one surface of the semiconductor substrate;

the means for forming the hole (22) in the semiconductor substrate ($6_{\_C1}$) so as to penetrate from the one surface to the other surface of the semiconductor substrate ($6_{\_C1}$), at the position communicating with the passage formed by the groove (26); and the means for forming the electrode extraction hole (24), for electrically connecting the fixed electrode ($2_{\_C1}$) to the semiconductor substrate ($6_{\_C1}$), in the insulative substrate ($7_{\_C1}$) so as to penetrate from the one surface to the other surface of the insulative substrate ($7_{\_C1}$), at the position communicating with the passage formed by the groove (26).

[5] The electrostatic capacitance-type acceleration sensor having the capacitor (C1) which electrostatic capacitance between the movable electrode (3) and the fixed electrode ($2_{\_C1}$) changes according to the displacement acceleration of the movable electrode (3), the sensor includes:

the insulative substrate ($7_{\_C1}$) on which the fixed electrode ($2_{\_C1}$) of the capacitor is formed as the film; and the semiconductor substrate ($6_{\_C1}$) which is joined to the one surface of the insulative substrate ($7_{\_C1}$) on the opposite side of the other surface thereof on which the fixed electrode ($2_{\_C1}$) is formed as the film, wherein the groove (26) is formed on at least one of the one surface of the insulative substrate ($7_{\_C1}$) and the one surface of the semiconductor substrate ($6_{\_C1}$) to which the insulative substrate ($7_{\_C1}$) is joined, the one surface of the insulative substrate being on the opposite side of the other surface thereof on which the fixed electrode ($2_{\_C1}$) is formed as the film, wherein the first hole (22) is formed in the semiconductor substrate ($6_{\_C1}$) so as to penetrate from the one surface to the other surface of the semiconductor substrate ($6_{\_C1}$), at the position communicating with the passage formed by the groove (26), and wherein the second hole (24) for electrode extraction, for electrically connecting the fixed electrode ($2_{\_C1}$) to the semiconductor substrate ($6_{\_C1}$), is formed in the insulative substrate ($7_{\_C1}$) so as to penetrate from the one surface to the other surface of the insulative substrate ($7_{\_C1}$), at the position communicating with the passage formed by the groove (26).

Although this invention is explained in detail with reference to the particular embodiment, it will be apparent for those skilled in the art that various changes and modifications can be made without departing from the spirit and range of this invention.

The present application is based on Japanese Patent Application (Japanese Patent Application No. 2012-78169) filed on Mar. 29, 2012, the content of which is incorporated herein by reference.

INDUSTRIAL APPLICABILITY

According to this invention, yield can be improved at the time of fabricating the electrostatic capacitance-type acceleration sensor provided with the ventilation passage for adjusting the pressure of the inside of the sensor elements. This invention attaining such the effects is useful in a field relating to the fabrication of the electrostatic capacitance-type acceleration sensor.

REFERENCE SIGNS LIST 1 acceleration sensor
$2_{-C1}$, $2_{-C2}$ fixed electrode
3 movable electrode
4 cantilever
5 pressure adjustment hole
$6_{-CC}$, $6_{-C2}$ silicon layer
$7_{-C1}$, $7_{-C2}$ glass layer
$8_{-C1}$, $8_{-C2}$ external-electrode extraction through-hole
9 pressure adjustment passage
21 silicon wafer
22, 24 hole
23 glass substrate
25 electrode
26 groove

The invention claimed is:

1. A method for fabricating an electrostatic capacitance-type acceleration sensor having a capacitor for which electrostatic capacitance between a movable electrode and a fixed electrode changes according to displacement of the movable electrode, the method comprising steps of:
forming a groove on at least one of one surface of an insulative substrate on which the fixed electrode is formed as a film and one surface of a semiconductor substrate to which the insulative substrate is joined, the one surface of the insulative substrate being on an opposite side of the other surface of the insulative substrate on which the fixed electrode is formed as the film, and the insulative substrate being joined to the one surface of the semiconductor substrate;
forming a hole in the semiconductor substrate so as to penetrate from the one surface of the semiconductor substrate to the other surface of the semiconductor substrate, the hole communicating with a hollow passage formed by the groove; and
forming an electrode extraction hole, for electrically connecting the fixed electrode to the semiconductor substrate, in the insulative substrate so as to penetrate from the one surface of the insulative substrate to the other surface of the insulative substrate, the electrode extraction hole communicating with the hollow passage formed by the groove,
wherein the hole, the hollow passage formed by the groove, and the electrode extraction hole are configured to communicate damping gas to the movable electrode, and
wherein the hole is directly connected to the electrode extraction hole by the groove.

2. The method for fabricating an electrostatic capacitance-type acceleration sensor according to claim 1, wherein
the electrostatic capacitance-type acceleration sensor includes the capacitor comprising a first capacitor for which electrostatic capacitance between the movable electrode and the first fixed electrode changes according to the displacement of the movable electrode, and a second capacitor for which electrostatic capacitance between the movable electrode and a second fixed electrode changes according to the displacement of the movable electrode in a contrary manner to the first capacitor, and wherein
the step of forming the groove forms the groove on at least one of the one surface of the insulative substrate on which one of the fixed electrode and the second fixed electrode is formed as the film and the one surface of the semiconductor substrate to which the insulative substrate is joined, the one surface of the insulative substrate being on the opposite side of the other surface of the insulative substrate on which the fixed electrode is formed as the film, and the insulative substrate being joined to the one surface of the semiconductor substrate.

3. The method for fabricating an electrostatic capacitance-type acceleration sensor according to claim 1, wherein the step of forming the electrode extraction hole in the insulative substrate forms the electrode extraction hole in the insulative substrate, to which the semiconductor substrate is joined, wherein the electrode extraction hole extends from the other surface of the insulative substrate on which the fixed electrode is formed as the film.

4. An electrostatic capacitance-type acceleration sensor having a capacitor for which electrostatic capacitance between a movable electrode and a fixed electrode changes according to displacement acceleration of the movable electrode, comprising:
an insulative substrate on which the fixed electrode of the capacitor is formed as a film; and
a semiconductor substrate which is joined to one surface of the insulative substrate on an opposite side of the other surface of the insulative substrate on which the fixed electrode is formed as the film,
wherein a groove is formed on at least one of the one surface of the insulative substrate and the one surface of the semiconductor substrate to which the insulative substrate is joined, the one surface of the insulative substrate being on the opposite side of the other surface of the insulative substrate on which the fixed electrode is formed as the film,
wherein a first hole is formed in the semiconductor substrate so as to penetrate from the one surface of the semiconductor substrate to the other surface of the semiconductor substrate, the first hole communicating with a hollow passage formed by the groove,
wherein a second hole for electrode extraction, for electrically connecting the fixed electrode to the semiconductor substrate, is formed in the insulative substrate so as to penetrate from the one surface of the insulative substrate to the other surface of the insulative substrate, the second hole communicating with the hollow passage formed by the groove,
wherein the first hole, the hollow passage formed by the groove, and the second hole are configured to communicate damping gas to the movable electrode, and wherein the first hole is directly connected to the second hole by the groove.

* * * * *